(12) United States Patent
Li et al.

(10) Patent No.: US 11,802,807 B2
(45) Date of Patent: Oct. 31, 2023

(54) LEAK DETECTION APPARATUS FOR AN INFORMATION HANDLING SYSTEM

(71) Applicant: DELL PRODUCTS, LP, Round Rock, TX (US)

(72) Inventors: Chao Hung (Brian) Li, New Taipei (TW); Wen Hung (Steven) Lu, Taipei (TW)

(73) Assignee: Dell Products L.P., Round Rock, TX (US)

( * ) Notice: Subject to any disclaimer, the term of this patent is extended or adjusted under 35 U.S.C. 154(b) by 662 days.

(21) Appl. No.: 16/583,084

(22) Filed: Sep. 25, 2019

(65) Prior Publication Data

US 2021/0088404 A1   Mar. 25, 2021

(51) Int. Cl.
*G01M 3/18*   (2006.01)
*F28F 27/00*   (2006.01)
*G05D 7/06*   (2006.01)
*H05K 7/20*   (2006.01)
*G05B 15/02*   (2006.01)

(52) U.S. Cl.
CPC .............. *G01M 3/183* (2013.01); *F28F 27/00* (2013.01); *G05B 15/02* (2013.01); *G05D 7/0676* (2013.01); *H05K 7/20309* (2013.01); *H05K 7/20318* (2013.01); *H05K 7/20381* (2013.01); *F28F 2265/16* (2013.01)

(58) Field of Classification Search
CPC ...... G01M 3/183; F28F 27/00; F28F 2265/16; G05B 15/02; G05D 7/0676; H05K 7/20309; H05K 7/20318; H05K 7/20381
See application file for complete search history.

(56) References Cited

U.S. PATENT DOCUMENTS

| | | | | |
|---|---|---|---|---|
| 6,812,451 | B2* | 11/2004 | Bluemcke | G01V 8/10 250/221 |
| 8,186,874 | B2 | 5/2012 | Sinbar et al. | |
| 9,552,871 | B1* | 1/2017 | Shau | H01L 21/823871 |
| 2004/0025045 | A1* | 2/2004 | Chan | G06F 21/57 726/16 |
| 2005/0201177 | A1* | 9/2005 | Shiraishi | G11C 16/105 365/222 |
| 2013/0173064 | A1* | 7/2013 | Fadell | G06F 3/016 700/276 |
| 2013/0206359 | A1* | 8/2013 | Bertilsson | F28F 3/005 165/166 |

(Continued)

FOREIGN PATENT DOCUMENTS

| | | | |
|---|---|---|---|
| CN | 107024512 A | * | 8/2017 |
| JP | 2016121958 A | * | 7/2016 |
| JP | 2018132330 A | * | 8/2018 |

OTHER PUBLICATIONS

CN107024512A mt (Year: 2017).*
JP 2018132330 A mt (Year: 2018).*
JP-2016121958-A mt (Year: 1996).*

*Primary Examiner* — Gordon A Jones
(74) *Attorney, Agent, or Firm* — Larson Newman, LLP

(57) ABSTRACT

A leak inhibition/detection device includes an absorbent material, a leak sensor in contact with the absorbent material, and an enclosure surrounding the absorbent material. The leak inhibition/detection device is configured to surround a joint between tubing and a cold plate/evaporator or a radiator/condenser of a liquid cooling module of an information handling system.

17 Claims, 5 Drawing Sheets

(56) References Cited

U.S. PATENT DOCUMENTS

| | | | |
|---|---|---|---|
| 2013/0277008 A1* | 10/2013 | Ishikura | F28F 11/00 |
| | | | 165/200 |
| 2017/0181329 A1 | 6/2017 | Shelnutt et al. | |
| 2017/0218096 A1* | 8/2017 | Yabuguchi | C08F 2/32 |
| 2018/0275198 A1* | 9/2018 | Maekawa | G01R 31/318575 |
| 2018/0341301 A1* | 11/2018 | Shabbir | G06F 1/206 |
| 2019/0141862 A1 | 5/2019 | Shelnutt et al. | |
| 2019/0368832 A1* | 12/2019 | Huang | G01M 3/185 |
| 2020/0282376 A1* | 9/2020 | Asano | B81B 7/02 |
| 2020/0302352 A1* | 9/2020 | Hubbard | G05B 15/02 |
| 2021/0116391 A1* | 4/2021 | Subrahmanyam | G01M 3/38 |
| 2021/0208019 A1* | 7/2021 | Karimi | G01M 3/182 |
| 2022/0065735 A1* | 3/2022 | Hilkene | G05B 15/02 |
| 2023/0011016 A1* | 1/2023 | Martinson | G02F 1/163 |

* cited by examiner

LEAK DETECTION APPARATUS FOR AN INFORMATION HANDLING SYSTEM

FIELD OF THE DISCLOSURE

The present disclosure generally relates to information handling systems, and more particularly relates to leak detection in an information handling system.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination. There is a demand for information handling system with higher reliability and performance to process data and information.

SUMMARY

A leak inhibition/detection device can include an absorbent material, a leak sensor in contact with the absorbent material, and an enclosure surrounding the absorbent material. The leak inhibition/detection device can surround a joint between tubing and a cold plate/evaporator or a radiator/condenser of a liquid cooling module of an information handling system.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
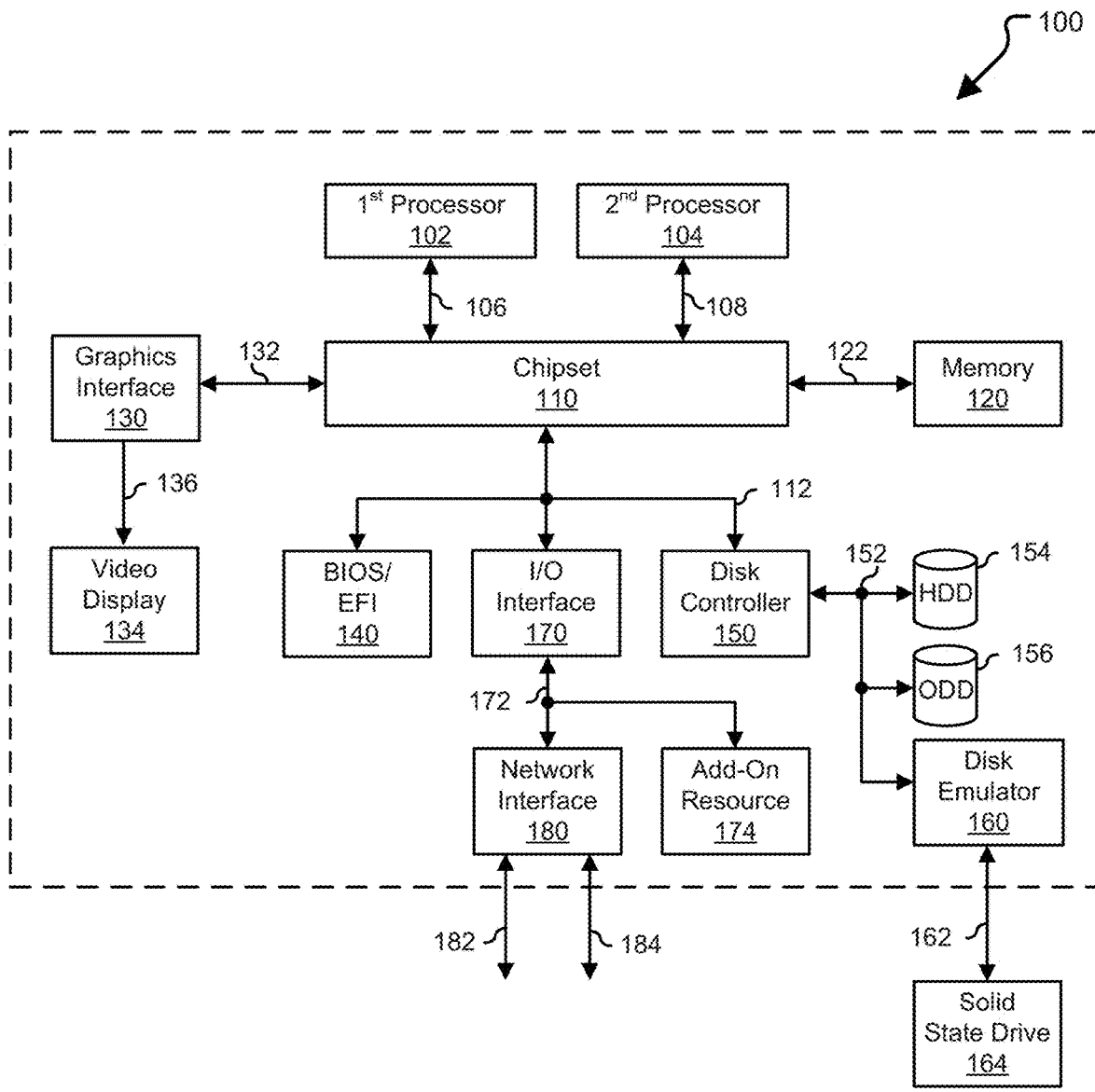
FIG. 1 is a block diagram illustrating an information handling system according to an embodiment of the present disclosure.

FIG. 1 illustrates a generalized embodiment of information handling system 100. For purpose of this disclosure information handling system 100 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 100 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 100 can include processing resources for executing machine-executable code, such as a central processing unit (CPU), a programmable logic array (PLA), an embedded device such as a System-on-a-Chip (SoC), or other control logic hardware. Information handling system 100 can also include one or more computer-readable medium for storing machine-executable code, such as software or data. Additional components of information handling system 100 can include one or more storage devices that can store machine-executable code, one or more communications ports for communicating with external devices, and various input and output (I/O) devices, such as a keyboard, a mouse, and a video display. Information handling system 100 can also include one or more buses operable to transmit information between the various hardware components.

Information handling system 100 can include devices or modules that embody one or more of the devices or modules described above, and operates to perform one or more of the methods described above. Information handling system 100 includes a processors 102 and 104, a chipset 110, a memory 120, a graphics interface 130, include a basic input and output system/extensible firmware interface (BIOS/EFI) module 140, a disk controller 150, a disk emulator 160, an input/output (I/O) interface 170, and a network interface 180. Processor 102 is connected to chipset 110 via processor interface 106, and processor 104 is connected to chipset 110 via processor interface 108. Memory 120 is connected to chipset 110 via a memory bus 122. Graphics interface 130 is connected to chipset 110 via a graphics interface 132, and provides a video display output 136 to a video display 134. In a particular embodiment, information handling system 100 includes separate memories that are dedicated to each of processors 102 and 104 via separate memory interfaces. An example of memory 120 includes random access memory (RAM) such as static RAM (SRAM), dynamic RAM (DRAM), non-volatile RAM (NV-RAM), or the like, read only memory (ROM), another type of memory, or a combination thereof.

BIOS/EFI module 140, disk controller 150, and I/O interface 170 are connected to chipset 110 via an I/O channel 112. An example of I/O channel 112 includes a Peripheral Component Interconnect (PCI) interface, a PCI-Extended (PCI-X) interface, a high-speed PCI-Express (PCIe) interface, another industry standard or proprietary communication interface, or a combination thereof. Chipset 110 can also include one or more other I/O interfaces, including an Industry Standard Architecture (ISA) interface, a Small Computer Serial Interface (SCSI) interface, an Inter-Integrated Circuit (I2C) interface, a System Packet Interface (SPI), a Universal Serial Bus (USB), another interface, or a combination thereof. BIOS/EFI module 140 includes BIOS/EFI code operable to detect resources within information handling system 100, to provide drivers for the resources, initialize the resources, and access the resources. BIOS/EFI module 140 includes code that operates to detect resources within information handling system 100, to provide drivers for the resources, to initialize the resources, and to access the resources.

Disk controller 150 includes a disk interface 152 that connects the disc controller to a hard disk drive (HDD) 154, to an optical disk drive (ODD) 156, and to disk emulator 160. An example of disk interface 152 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 160 permits a solid-state drive 164 to be connected to information handling system 100 via an external interface 162. An example of external interface 162 includes a USB interface, an IEEE 1194 (Firewire) interface, a proprietary interface, or a combination thereof. Alternatively, solid-state drive 164 can be disposed within information handling system 100.

I/O interface 170 includes a peripheral interface 172 that connects the I/O interface to an add-on resource 174 and to network interface 180. Peripheral interface 172 can be the same type of interface as I/O channel 112, or can be a different type of interface. As such, I/O interface 170 extends the capacity of I/O channel 112 when peripheral interface 172 and the I/O channel are of the same type, and the I/O interface translates information from a format suitable to the I/O channel to a format suitable to the peripheral channel 172 when they are of a different type. Add-on resource 174 can include a data storage system, an additional graphics interface, a network interface card (NIC), a sound/video processing card, another add-on resource, or a combination thereof. Add-on resource 174 can be on a main circuit board, on separate circuit board or add-in card disposed within information handling system 100, a device that is external to the information handling system, or a combination thereof.

Network interface 180 represents a NIC disposed within information handling system 100, on a main circuit board of the information handling system, integrated onto another component such as chipset 110, in another suitable location, or a combination thereof. Network interface device 180 includes network channels 182 and 184 that provide interfaces to devices that are external to information handling system 100. In a particular embodiment, network channels 182 and 184 are of a different type than peripheral channel 172 and network interface 180 translates information from a format suitable to the peripheral channel to a format suitable to external devices. An example of network channels 182 and 184 includes InfiniBand channels, Fibre Channel channels, Gigabit Ethernet channels, proprietary channel architectures, or a combination thereof. Network channels 182 and 184 can be connected to external network resources (not illustrated). The network resource can include another information handling system, a data storage system, another network, a grid management system, another suitable resource, or a combination thereof.

In various embodiments, it can be desirable to verify first use of an information handling system. Through first use verification, a user can know that they are the first person to use the information handling system since it left the manufacturing facility. First use verification can prevent a third-party reseller from passing off used or returned hardware as new. Additionally, first use verification can be used to detect tampering with the system, such as the installation of malicious components. The first use verification system can provide peace of mind to the end user.

Figure 2:
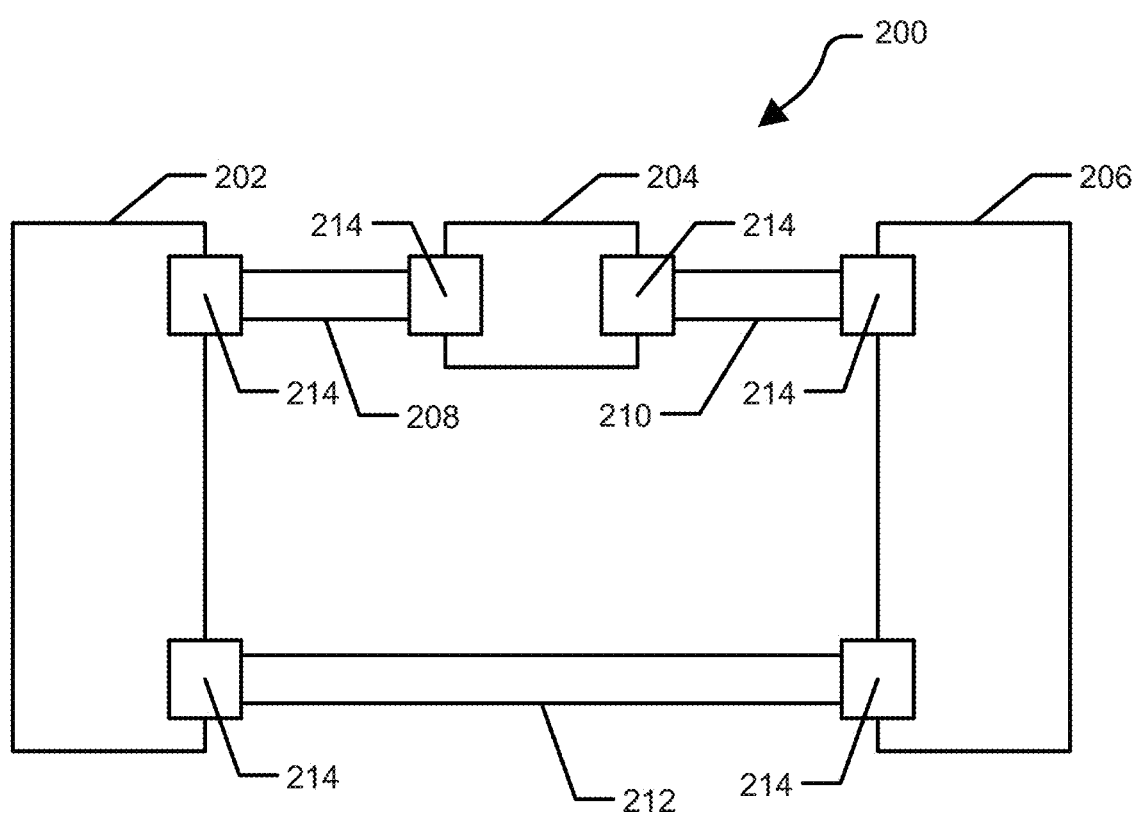
FIG. 2 is a block diagram illustrating a liquid cooling module according to an embodiment of the present disclosure.

FIG. 2 illustrates an exemplary liquid cooling system 200. Liquid cooling system 200 includes a cold plate/evaporator 202, a pump 204, and a radiator/condenser 206. Liquid cooling system 200 further includes tubing 208, 210, and 212 connecting cold plate/evaporator 202, pump 204, and radiator/condenser 206.

Pump 204 can circulate a coolant liquid through the tubing 208, 210, and 212 and between cold plate/evaporator 202 and radiator/condenser 206. Cold plate/evaporator 202 can transfer heat from a component of an information handling system to the coolant liquid. For example, the cold plate may transfer heat from processor 102 or 104, chipset 110, memory 120, or the like to a coolant liquid. Radiator/condenser 206 can cool the coolant liquid, such as by transferring the heat to air exhausting from the information handling system.

In various embodiments, liquid cooling systems can be more effective at removing waste heat from hot components than traditional forced-air cooling systems due to the higher heat capacity of the liquid than air. Additionally, liquid cooling systems can be quieter and take up less space than a forced air-cooling system. However, a leak in a liquid cooling system can cause damage to components of the information handling system if the liquid comes in contact with sensitive electronic components. To inhibit damage to the system from a leak, liquid cooling system 200 can have one or more leak inhibition/detection devices 214. In various embodiments, leaks can occur at joints between the tubing 208, 210, and 212, and cold plate/evaporator 202, pump 204, or radiator/condenser 206. Leak inhibition/detection devices 214 can be placed at one or more of the joints to contain and detect leaks as they occur, thereby protecting the information system from damage due to leaking coolant.

Figure 3:
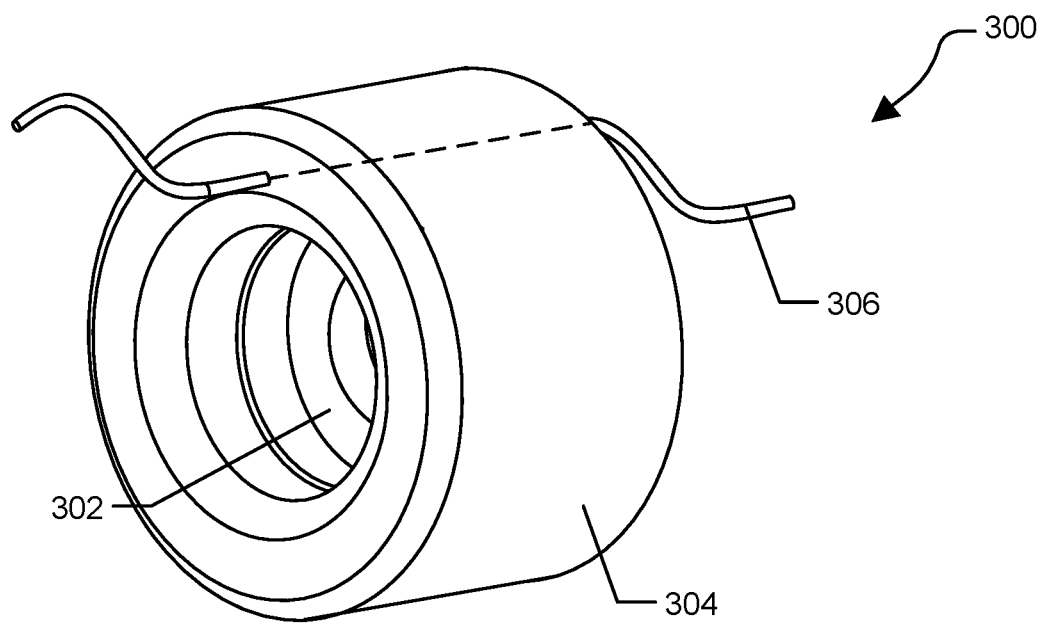
FIGS. 3, 4, and 5 are diagrams illustrating a joint mechanism for detecting and inhibiting leaks in a liquid cooling module according to an embodiment of the present disclosure.
Figure 4:
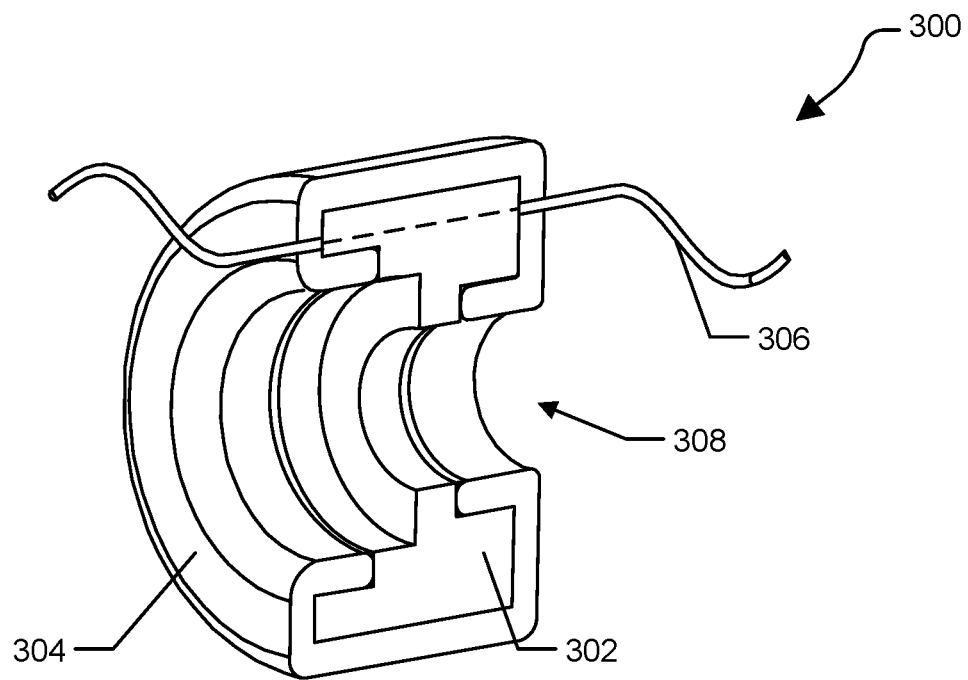
Figure 5:
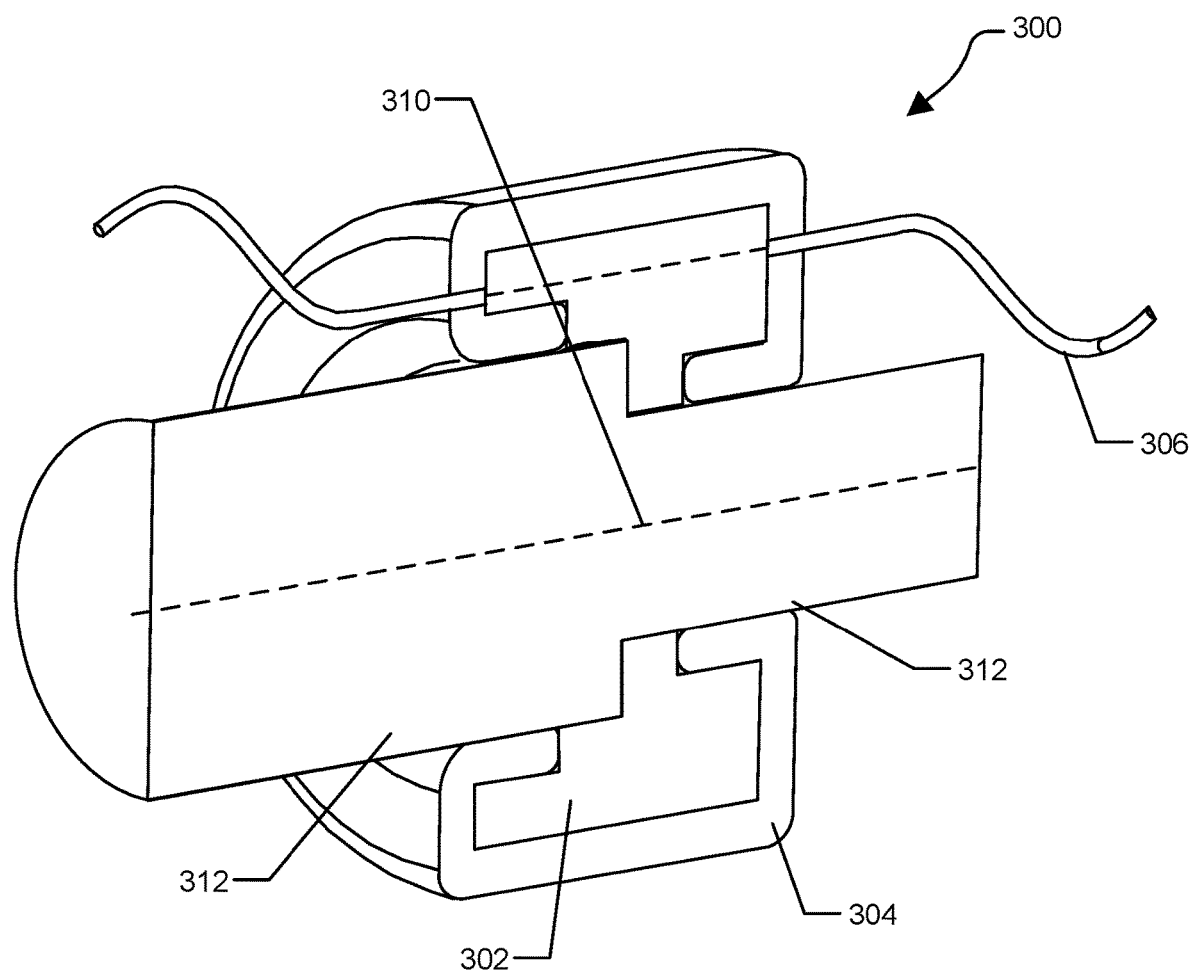

FIGS. 3, 4, and 5 illustrate leak inhibition/detection devices 300, such as leak inhibition/detection devices 214. The leak inhibition/detection devices 300 can include an absorbent material 302 and a casing 304 surrounding the absorbent material 302. A leak sensor 306 can pass through the casing 304 and contact the absorbent material 302. The leak inhibition/detection devices 300 can be an annular device with a central bore 308 through which the tubing can pass. The central bore can be shaped to form a tight fight with the joint 310 of the tubing and a component of the liquid cooling system.

In various embodiments, the absorbent material 302 can include a fiber, such as a synthetic fiber or a natural fiber.

Examples of suitable natural fibers can include cotton fibers, hemp fibers, bamboo fibers, and the like. Examples of suitable synthetic fiber can include polyester microfibers, polyamide microfibers, polypropylene microfibers, or any combination thereof. In various embodiments, the absorbent material 302 can include a superabsorbent polymer, such as polyacrylamide copolymer, ethylene maleic anhydride copolymer, cross-linked carboxymethylcellulose, polyvinyl alcohol copolymers, cross-linked polyethylene oxide, starch grafted copolymer of polyacrylonitrile, and any combination thereof.

In various embodiments, the casing 304 can be a flexible material, such as rubber, that is impermeable to the coolant liquid. The flexible casing 304 can form a seal 312 with the tubing or component of the liquid cooling system on either side of the joint 310 while keeping the absorbent material 302 in close contact with the joint.

In various embodiments, the leak sensor 306 can be a hygristor configured to change resistance in response to a change in the humidity within the casing. Alternatively, the leak sensor 306 can be a liquid presence sensor that closes or opens a circuit when in contact with the cooling liquid. In some embodiments, the leak sensor 306 can be a pressure sensor detecting a change in pressure within the leak inhibition/detection device as the cooling liquid is absorbed by the absorbent material 302. In other embodiments, the leak sensor can be an optical sensor that detects a change in optical properties of the absorbent material 302 as the cooling liquid is absorbed.

In various embodiments, the absorbent material 302 can provide a finite ability to capture the cooling liquid and prevent damage to components of the system. The leak sensor 306 can detect the leak prior to the liquid absorbing material reaching capacity. This can provide a period of time between the detection of the leak and potential damage to components of the system due to the leak. This can provide sufficient time to shut down the system to avoid liquid damage. In some embodiments, the signal from the leak sensor 306 can provide an indication of the amount of cooling liquid that has been absorbed by the absorbent material 302 and the information handling system can estimate the size of the leak and how long until the absorbent material 302 reaches capacity from the rate of change in the signal from the leak sensor 306.

In various embodiments, the leak sensor 306 can be connected to a general purpose input/output (GPIO) coupled to an out-of-band management controller, such as an integrated Dell Remote Access Controller (iDRAC). The out-of-band management controller can initiated a shutdown of the system and power down the liquid cooling module. Additionally, the out-of-band management controller can be configured to log the event or send an alert to a system administrator.

Figure 6:
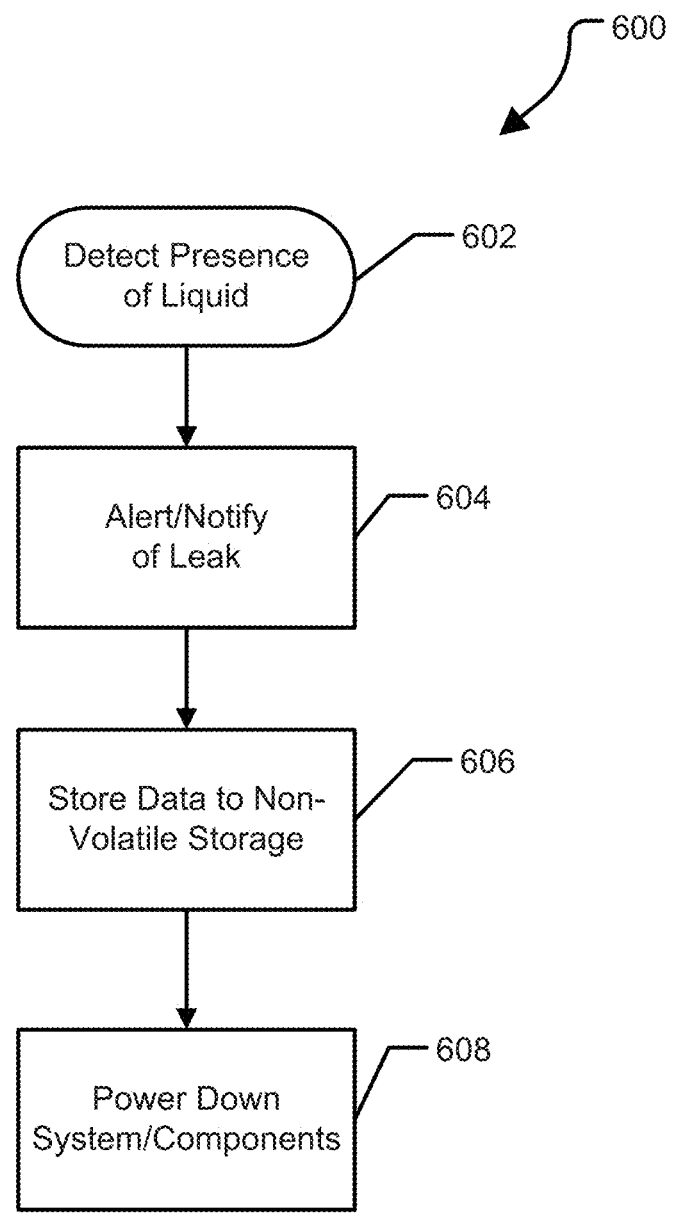
FIG. 6 is a flow diagram illustrating an exemplary method of responding to detection of a leak in a liquid cooling module according to an embodiment of the present disclosure.

FIG. 6 illustrates a method 600 of powering down the system in response to detecting the leak to avoid damage to components. At 602, a leak sensor detects the presence of a liquid absorbed by a absorbent material. In various embodiments, the leak sensor can detect the liquid through a change in the resistance of a low voltage current through the absorbent material. In other embodiments, the leak sensor can detect a change in pressure as the absorbent material swells upon the absorption of the liquid. In yet other embodiments, the leak sensor can detect a change in an optical property of the absorbent material in the presence of the liquid.

At 604, an alert can be sent to an administrator to notify of the leak. At 606, data can optionally be stored to a non-volatile storage device. In various embodiments, open files can be saved and open applications can be exited. In various embodiments, virtual machines or virtual containers can be transferred to another system to provide continued services. At 608, the system can power down components to prevent shorting due to the leakage of the liquid.

In various embodiments, the liquid presence sensor can provide an indication of the amount of liquid absorbed by the liquid absorbing material. This can provide an indication of the leakage rate and an estimate of when the liquid absorbing material will reach capacity. The shutdown procedure can be modified based on the leakage rate and the time until the liquid absorbing material is overloaded. For example, in a slow leak, the system state and data can be transferred to another system whereas in a fast leak a rapid power down procedure can occur, losing data that has not been stored to a non-volatile storage but preventing damage to the hardware.

In various embodiments, the system may turn the liquid cooling off upon detecting the leak and perform the shutdown procedure in a period of time before the components reach a critical temperature.

Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. An information handling system, comprising:
    a processor; and
    a liquid cooling module thermally coupled to the processor, the liquid cooling module including:
        a cold plate/evaporator configured to transfer heat from the processor to a coolant;
        a radiator/condenser configured to removing heat from the coolant;
        tubing connecting the cold plate/evaporator and the radiator/condenser;
        a pump to circulate the coolant through the tubing; and
        at least one leak inhibition/detection device positioned to surround a joint between the tubing and the cold plate/evaporator or the radiator/condenser, the leak inhibition/detection device including an absorbent material, a leak sensor, and an enclosure, wherein the leak sensor is an optical sensor that detects a change in optical properties of the absorbent material as a cooling liquid is absorbed, wherein the leak sensor provides a signal that includes an indication of an amount of the coolant that has been absorbed by the absorbent material, wherein a size of a leak is determined based on a rate of change in the signal from the leak sensor.

2. The information handling system of claim 1, wherein the absorbent material includes a fiber or a polymer.

3. The information handling system of claim 2, wherein the fiber includes a natural fiber or a synthetic fiber.

4. The information handling system of claim 1, wherein the processor is configured to:
    receive a signal from the leak sensor; and
    shut down the system.

5. The information handling system of claim 4, wherein shutting down the system includes writing unsaved data from a memory to a storage and powering down the information handling system.

6. The information handling system of claim 4, wherein the processor is further configured to notify a user of the information handling system after receiving the signal from the leak sensor and prior to shutting down the system.

7. The information handling system of claim 1, wherein the absorbent material is configured to be in direct contact with the joint.

8. A liquid cooling module for removing heat from an information handling system, the liquid cooling module including:
- a cold plate/evaporator configured to transfer heat to a coolant;
- a radiator/condenser configured to removing heat from the coolant;
- a pump to circulate the coolant through tubing connecting the cold plate/evaporator and the radiator/condenser; and
- at least one leak inhibition/detection device configured to surround a joint between the tubing and the cold plate/evaporator or the radiator/condenser, the leak inhibition/detection device including an absorbent material, a leak sensor, and an enclosure, wherein the leak sensor is an optical sensor that detects a change in optical properties of the absorbent material as a cooling liquid is absorbed, wherein the leak sensor provides an indication of an amount of the coolant that has been absorbed by the absorbent material, wherein a size of a leak is determined based on a rate of change in the signal from the leak sensor.

9. The liquid cooling module of claim 8, wherein the absorbent material includes a fiber or a polymer.

10. The liquid cooling module of claim 9, wherein the fiber includes a natural fiber or a synthetic fiber.

11. The liquid cooling module of claim 8, wherein the leak sensor is configured to provide a signal to initiate a shutdown of the information handling system when a leak is detected.

12. The liquid cooling module of claim 8, wherein the absorbent material is configured to be in direct contact with the joint.

13. An apparatus comprising:
- an absorbent material;
- a leak sensor in contact with the absorbent material; and
- an enclosure surrounding the absorbent material,
- wherein the apparatus is configured to surround a joint between a tubing and a cold plate/evaporator or a radiator/condenser of a liquid cooling system of an information handling system, wherein the leak sensor is an optical sensor that detects a change in optical properties of the absorbent material as a cooling liquid is absorbed, wherein the leak sensor provides an indication of an amount of the cooling liquid that has been absorbed by the absorbent material, wherein a size of a leak is determined based on a rate of change in the signal from the leak sensor.

14. The apparatus of claim 13, wherein the absorbent material includes a fiber or a polymer.

15. The apparatus of claim 14, wherein the fiber includes a natural fiber or a synthetic fiber.

16. The apparatus of claim 13, wherein the leak sensor is configured to provide a signal to initiate a shutdown of the information handling system when a leak is detected.

17. The apparatus of claim 13, wherein the absorbent material is configured to be in direct contact with the joint.

* * * * *